United States Patent
Cho et al.

(10) Patent No.: US 11,756,975 B2
(45) Date of Patent: Sep. 12, 2023

(54) IMAGE SENSOR AND IMAGE SENSING METHOD TO GENERATE HIGH SENSITIVITY IMAGE THROUGH THIN LENS ELEMENT AND MICRO LENS ARRAY

(71) Applicant: SAMSUNG ELECTRONICS CO., LTD., Suwon-si (KR)

(72) Inventors: Yang Ho Cho, Seongnam-si (KR); Seunghoon Han, Seoul (KR); Kyuhwan Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 16/834,428

(22) Filed: Mar. 30, 2020

(65) Prior Publication Data

US 2021/0118932 A1     Apr. 22, 2021

(30) Foreign Application Priority Data

Oct. 21, 2019   (KR) .......................... 10-2019-0130481

(51) Int. Cl.
*H01L 27/146* (2006.01)
*G02B 3/00* (2006.01)
(Continued)

(52) U.S. Cl.
CPC ...... *H01L 27/14627* (2013.01); *G02B 3/0056* (2013.01); *H01L 27/14603* (2013.01);
(Continued)

(58) Field of Classification Search
CPC ......... G02F 1/133526; G02F 1/133504; G02F 1/133514; G02F 1/294; H01L 27/14627;
(Continued)

(56) References Cited

U.S. PATENT DOCUMENTS

| | | | |
|---|---|---|---|
| 7,964,835 B2* | 6/2011 | Olsen ...................... | H04N 5/332 348/262 |
| 8,094,394 B2* | 1/2012 | Yamada ................ | G02B 5/008 359/885 |

(Continued)

FOREIGN PATENT DOCUMENTS

| | | |
|---|---|---|
| KR | 10-2014-0062801 A | 5/2014 |
| KR | 10-2017-0015108 A | 2/2017 |
| WO | 2015170080 A1 | 11/2015 |

OTHER PUBLICATIONS

Jacques Duparré, Peter Dannberg, Peter Schreiber, Andreas Bräuer, and Andreas Tünnermann, "thin compound-eye camera," 2005, Optica publishing group, vol. 44, issue 15, pp. 2949-2956 (Year: 2005).*

(Continued)

*Primary Examiner* — Jennifer D Bennett
*Assistant Examiner* — Erin R Garber
(74) *Attorney, Agent, or Firm* — Sughrue Mion, PLLC

(57) ABSTRACT

An image sensor includes a plurality of thin lens elements, each of the plurality of thin lens elements including a plurality of scatterers configured to concentrate light of a partial wavelength band among light incident on the image sensor. The image sensor further includes a micro lens array configured to concentrate light of another wavelength band wider than the partial wavelength band, and a sensing element configured to sense light passing through the plurality of thin lens elements and the micro lens array.

20 Claims, 9 Drawing Sheets

(51) Int. Cl.
   *H04N 23/55*       (2023.01)
   *H04N 23/84*       (2023.01)
   *H04N 25/133*      (2023.01)
   *G02B 5/18*        (2006.01)
   *G02B 5/20*        (2006.01)

(52) U.S. Cl.
   CPC .. *H01L 27/14645* (2013.01); *H01L 27/14647* (2013.01); *H04N 23/55* (2023.01); *H04N 23/84* (2023.01); *G02B 5/1819* (2013.01); *G02B 5/1866* (2013.01); *G02B 5/1876* (2013.01); *G02B 5/201* (2013.01); *H04N 25/133* (2023.01)

(58) Field of Classification Search
   CPC .......... H01L 27/14647; H01L 51/5275; H01L 51/5268; H01L 27/14621; H01L 27/1462; H01L 27/14623; H04N 5/2254; H04N 9/0451; H04N 9/04557; H04N 9/317; H04N 9/3185; H04N 13/257; G02B 3/0056; G02B 27/0172; G02B 19/0014; G02B 27/095; G02B 2027/041; G02B 27/283; G02B 13/0035; G02B 13/0045; G02B 21/0076; G02B 27/0961; G02B 27/0966

See application file for complete search history.

(56) References Cited

U.S. PATENT DOCUMENTS

| | | | |
|---|---|---|---|
| 2005/0029433 | A1* | 2/2005 | Sakoh ............... H01L 27/14603 257/E27.151 |
| 2008/0030592 | A1 | 2/2008 | Border et al. |
| 2011/0080487 | A1 | 4/2011 | Venkataraman et al. |
| 2015/0049383 | A1 | 2/2015 | Janins et al. |
| 2017/0034500 | A1 | 2/2017 | Arbabi et al. |
| 2017/0146806 | A1 | 5/2017 | Lin et al. |
| 2019/0122378 | A1 | 4/2019 | Aswin |
| 2021/0366964 | A1* | 11/2021 | Ito .................... H01L 27/14685 |

OTHER PUBLICATIONS

Chan, Wai-San et al., Super-resolution reconstruction in a computational compound-eye imaging system, Feb. 23, 2007, Springer Science+Business Media, LLC, Multidim Syst Sign Process (2007) 18, 83-101 (Year: 2007).*

Christian Schlickriede et al. "Imaging through nonlinear metalens using second harmonic generation" Advanced Materials, vol. 30, Issue. 8, Feb. 22, 2018 [retrieved from https://onlinelibrary.wiley.com/doi/abs/10.1002/adma.201703843], (12 pages total).

Ming Lun Tseng et al. "Metalenses: Advances and Applications" Advanced Optical Materials, 2018, (16 pages total).

Fan Ye et al. "Integrated light-sheet illumination using metallic slit microlenses" Optics Express, vol. 26, No. 21, Oct. 15, 2018, (13 pages total).

* cited by examiner

IMAGE SENSOR AND IMAGE SENSING METHOD TO GENERATE HIGH SENSITIVITY IMAGE THROUGH THIN LENS ELEMENT AND MICRO LENS ARRAY

CROSS-REFERENCE TO RELATED APPLICATION

This application is based on and claims priority under 35 U.S.C. § 119 to Korean Patent Application No. 10-2019-0130481, filed on Oct. 21, 2019, in the Korean Intellectual Property Office, the disclosure of which is incorporated by reference herein in its entirety.

BACKGROUND

1. Field

The disclosure relates to technology for sensing an image, and more particularly, to an image sensor and an image sensing method with improved sensitivity.

2. Description of the Related Art

Due to development of optical technologies and image processing technologies, image capturing apparatuses are being utilized in a wide range of fields, for example, multimedia content, security and recognition. For example, an image capturing apparatus may be mounted in a mobile device, a camera, a vehicle or a computer, to capture an image, to recognize an object or to acquire data to control a device. A volume of an image capturing apparatus may be determined based on, for example, a size of a lens, a focal length of a lens or a size of a sensor. For example, the volume of the image capturing apparatus may depend on a size of a lens or a size of a sensor. As the size of the sensor decreases, an amount of light incident on the sensor may decrease. Accordingly, a resolution of an image may decrease, or it may be difficult to capture an image in a low illuminance environment. To reduce the volume of the image capturing apparatus, a multi-lens including small lenses may be used.

SUMMARY

According to example embodiments, an image sensor includes a plurality of thin lens elements, each of the plurality of thin lens elements including a plurality of scatterers configured to concentrate light of a partial wavelength band among light incident on the image sensor. The image sensor further includes a micro lens array configured to concentrate light of another wavelength band wider than the partial wavelength band, and a sensing element configured to sense light passing through the plurality of thin lens elements and the micro lens array.

At least two among the plurality of thin lens elements may be configured to concentrate light in different wavelength bands.

A first one among the plurality of thin lens elements may be configured to concentrate light in a first wavelength band corresponding to a first color, a second one among the plurality of thin lens elements may be configured to concentrate light in a second wavelength band corresponding to a second color different from the first color, and a third one among the plurality of thin lens elements is configured to concentrate light in a third wavelength band corresponding to a third color different from the first color and the second color.

The micro lens array may be further configured to concentrate the light of the other wavelength band wider than or equal to a range including the first wavelength band, the second wavelength band and the third wavelength band.

The plurality of thin lens elements and the micro lens array may be disposed to form a focal point on a plane of a sensing array in which the sensing element is arranged.

The image sensor may further include a processor configured to obtain chrominance information from a sensing region covered by the plurality of thin lens elements in a sensing array in which the sensing element is arranged, and obtain luminance information from a sensing region covered by the micro lens array.

The processor may be further configured to obtain an image, based on the chrominance information and the luminance information.

The micro lens array may include a plurality of micro lens elements arranged along an array plane, and the processor may be further configured to obtain a compound eye vision (CEV) image, based on light that is sensed by the sensing element through the plurality of micro lens elements, and obtain the luminance information, based on the obtained CEV image.

Each of the plurality of scatterers may be further configured to change a path of light incident on a respective one of the plurality of scatterers by delaying a phase of the light incident on the respective one of the plurality of scatterers.

The plurality of scatterers may be further configured to concentrate the light of the partial wavelength band, based on shapes and an arrangement of the plurality of scatterers and an interval between the plurality of scatterers.

The image sensor may further include a transparent substrate interposed between the sensing element and the micro lens array and between the sensing element and the plurality of thin lens elements.

The transparent substrate may include a block unit configured to block light passing through a first one among the plurality of thin lens elements from being incident on a sensing region covered by a second one among the plurality of thin lens elements.

The block unit may be disposed along a portion of an outer boundary of the sensing region.

The transparent substrate may be configured to space apart the plurality of thin lens elements from the micro lens array apart by a focal length, and the micro lens array may be disposed on a surface of the transparent substrate.

The plurality of scatterers may disposed on another surface of the transparent substrate.

A portion of the plurality of scatterers may protrude outward from the transparent substrate, and another portion of the plurality of scatterers may be disposed in the transparent substrate.

A portion of the plurality of scatterers may be disposed to face another portion of the plurality of scatterers, based on a virtual surface parallel to a plane on which the sensing element is disposed.

The image sensor may further include additional lens elements configured to concentrate the light incident on the image sensor to the plurality of thin lens elements, the additional lens elements being spaced apart from the plurality of thin lens elements.

The image sensor may be implemented as a mobile terminal.

According to example embodiments, an image sensing method performed by an image sensor, includes concentrating, by a plurality of scatterers included in each of a plurality of thin lens elements, light of a partial wavelength band among light incident on the image sensor, concentrating, by a micro lens array, light of another wavelength band wider than the partial wavelength band, and sensing, by a sensing element, light passing through the plurality of thin lens elements and the micro lens array.

According to example embodiments, an image sensor includes a plurality of thin lens elements, each of the plurality of thin lens elements including a plurality of scatterers configured to concentrate light of a color wavelength band among light incident on the image sensor. The image sensor further includes monochrome lens elements configured to concentrate light of a monochrome wavelength band wider than the color wavelength band, and a sensing element configured to sense light passing through the plurality of thin lens elements and the monochrome lens elements.

The monochrome lens elements may include a micro lens array configured to concentrate the light of the monochrome wavelength band.

The monochrome lens elements may include at least one thin lens element configured to concentrate the light of the monochrome wavelength band.

Additional aspects will be set forth in part in the description that follows and, in part, will be apparent from the description, or may be learned by practice of the presented embodiments of the disclosure.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
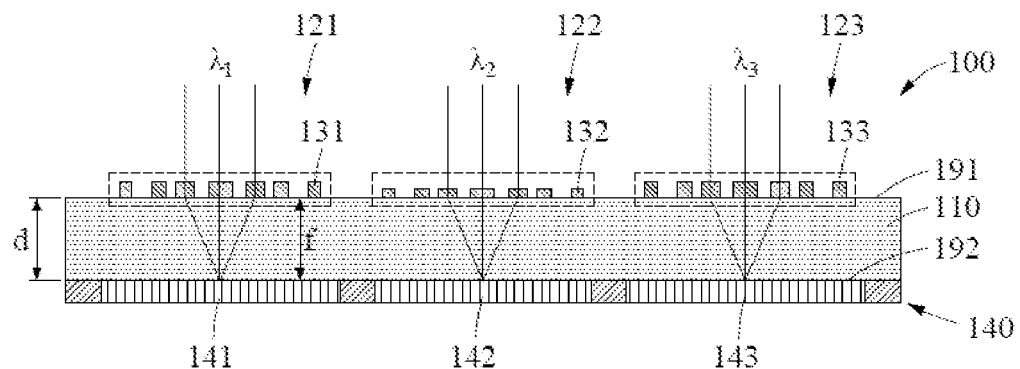
FIG. 1 is a cross-sectional view of an image sensor according to example embodiments.

Example embodiments will be described in detail with reference in the accompanying drawings, wherein like reference numerals refer to the like elements throughout.

The following structural or functional descriptions are examples to describe the example embodiments, and the scope of the example embodiments are not limited to the descriptions provided in the present specification. Various changes and modifications can be made thereto by those of ordinary skill in the art.

It may be further understood that the terms "comprises," "includes," and "comprising," and/or "including" when used in this specification, specify the presence of stated features, integers, steps, operations, elements, components or a combination thereof, but do not preclude the presence or addition of one or more other features, integers, steps, operations, elements, components, and/or groups thereof. Expressions such as "at least one of," when preceding a list of elements, modify the entire list of elements and do not modify the individual elements of the list. For example, the expression, "at least one of a, b, and c," may be understood as including only a, only b, only c, both a and b, both a and c, both b and c, or all of a, b, and c.

Unless otherwise defined herein, all terms used herein including technical or scientific terms have the same meanings as those generally understood by one of ordinary skill in the art. Terms defined in dictionaries generally used may be construed to have meanings matching with contextual meanings in the related art and are not to be construed as an ideal or excessively formal meaning unless otherwise defined herein.

Regarding the reference numerals assigned to the elements in the drawings, it may be noted that the same elements will be designated by the same reference numerals, wherever possible, even though they are shown in different drawings.

FIG. 1 is a cross-sectional view of an image sensor according to example embodiments.

An image sensor 100 of FIG. 1 may include a substrate 110, a plurality of thin lens elements 121, 122 and 123, and a sensing array 140.

The substrate 110 may have a shape of a plate. A first surface 191 and a second surface 192 of the substrate 110 may substantially be parallel to each other. However, the first surface 191 and the second surface 192 do not need to be completely parallel, and may also be obliquely parallel to each other. The substrate 110 and the sensing array 140 may be spaced apart from each other with an air layer therebetween. The substrate 110 may include a transparent material. The transparent material refers to a material having a high transmittance of light. For example, the substrate 110 may include any one or any combination of $Si_3N_4$, $SiO_2$, and a polymer such as polymethyl methacrylate (PMMA) or polydimethylsiloxane (PDMS). After a traveling path of incident light changes at the thin lens elements 121, 122 and 123, the incident light may be incident on the sensing array 140 by passing through the substrate 110.

The plurality of thin lens elements 121, 122 and 123 may be located on the first surface 191 of the substrate 110. Each of the plurality of thin lens elements 121, 122 and 123 may be designed to concentrate light in a predetermined wavelength band on the sensing array 140. For example, the thin lens elements 121, 122 and 123 may each include a plurality of scatterers 131, 132 and 133. For example, a thin lens element may include an optical element that changes a path of light by a difference in phase delays caused by the scatterers 131, 132 and 133. A lens designed based on a phase difference of light may be represented as a meta-lens. Thus, a thickness of a thin lens element may be hardly limited compared to that of an optical lens, and the thin lens element may be designed to be thin. The scatterers 131, 132 and 133 on surfaces of the thin lens elements 121, 122 and 123, respectively, may resonate light incident on each of the scatterers 131, 132 and 133. Each of the scatterers 131, 132 and 133 may be designed to properly delay a transmission phase of light incident on each of the scatterers 131, 132 and 133.

The scatterers 131, 132 and 133 that delay a transmission phase of light may be arranged on the first surface 191 of the substrate 110. The scatterers 131, 132 and 133 may be arranged to form a wave front of light transmitted through the first surface 191 of the substrate 110 at a target point of the sensing array 140. Also, the thin lens elements 121, 122 and 123 may change a traveling direction of the transmitted light with respect to the incident light by modulating the wave front of the light.

The thin lens element 121 may concentrate light of a first wavelength band (for example, a band including a wavelength of $\lambda_1$) among incident light. The thin lens element 122 may concentrate light of a second wavelength band (for example, a band including a wavelength of $\lambda_2$) among incident light. The thin lens element 123 may concentrate light of a third wavelength band (for example, a band including a wavelength of $\lambda_3$) among incident light. Each thin lens element may block light of the other wavelength bands. For example, the thin lens element 121 may block light of the second wavelength band and the third wavelength band, the thin lens element 122 may block light of the first wavelength band and the third wavelength band, and the thin lens element 123 may block light of the first wavelength band and the second wavelength band. Thus, an individual thin lens element may pass different pieces of spectrum information even though an additional color filter is absent. However, this is an example, and example embodiments are not limited thereto. For example, all the thin lens elements 121, 122 and 123 may not need to concentrate light in different wavelength bands, and two thin lens elements among the thin lens elements 121, 122 and 123 may concentrate light of the same wavelength.

The sensing array 140 may be located on the second surface 192 that faces the first surface 191 of the substrate 110. The sensing array 140 may include a plurality of sensing elements 141, 142 and 143. Each of the plurality of sensing elements 141, 142 and 143 may generate a signal indicating an intensity of incident light in response to light being incident. The sensing array 140 may be divided into sensing regions covered respectively by the thin lens elements 121, 122 and 123, which will be described below with reference to FIG. 5. For example, in the sensing array 140, a region covered by the thin lens element 121 may be a first sensing region, a region covered by the thin lens element 122 may be a second sensing region, and a region covered by the thin lens element 123 may be a third sensing region. A sensing element included in the first sensing region may be the sensing element 141, a sensing element included in the second sensing region may be the sensing element 142, and a sensing element included in the third sensing region may be the sensing element 143. Although the sensing elements are located adjacent to each other as shown in FIG. 1, example embodiments are not limited thereto. For example, the sensing elements may be located separately from each other.

The sensing elements 141, 142 and 143 may be located to respectively correspond to the thin lens elements 121, 122 and 123. For example, the sensing element 141 may sense light passing through the thin lens element 121. The sensing element 142 may sense light passing through the thin lens element 122. The sensing element 143 may sense light passing through the thin lens element 123. Each of the sensing elements 141, 142 and 143 may receive light. A processor may generate a first image through a third image based on sensing information acquired from the sensing elements 141, 142 and 143.

For example, each of the sensing elements 141, 142 and 143 may include devices configured to convert an optical signal into an electric signal. In an example, each of the sensing elements 141, 142 and 143 may include a charge-coupled device (CCD), or a complementary metal-oxide-semiconductor (CMOS). In another example, each of the sensing elements 141, 142 and 143 may include a photo-diode configured to convert light energy into electric energy.

Figure 2:
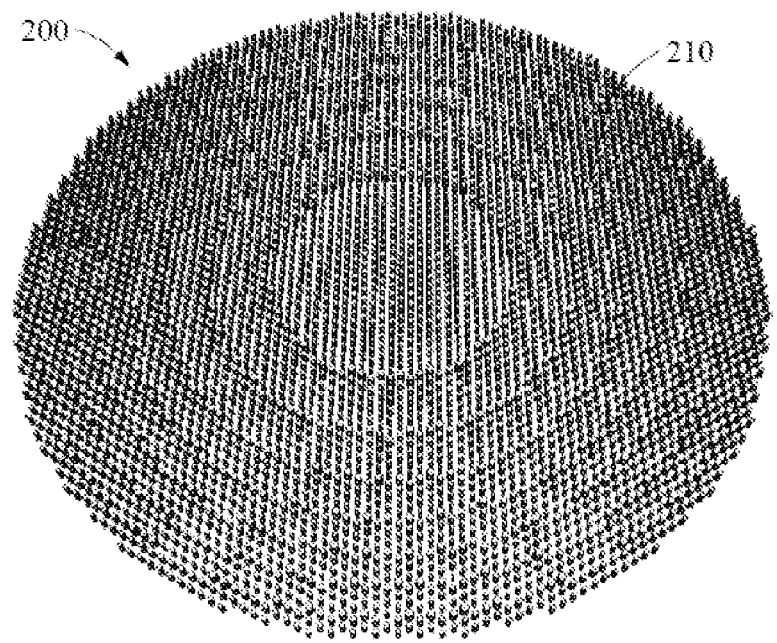
FIGS. 2 and 3 are perspective views of thin lens elements included in an image sensor according to example embodiments.
Figure 3:
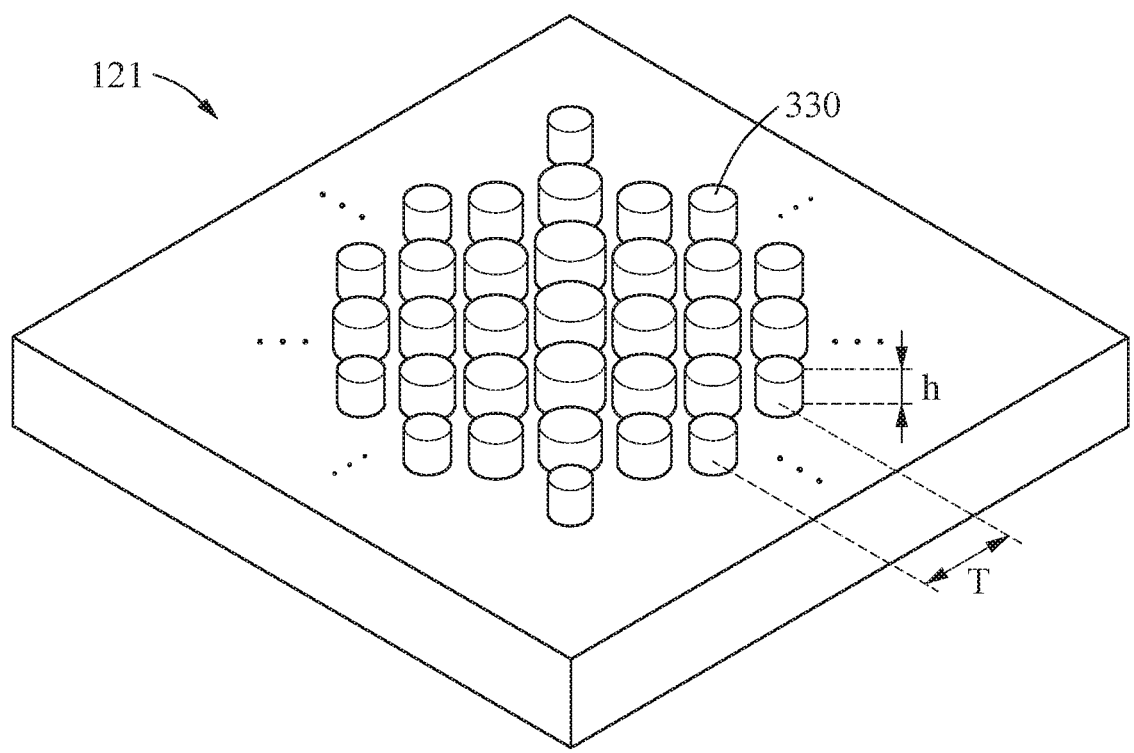

FIGS. 2 and 3 are perspective views of thin lens elements included in an image sensor according to example embodiments.

FIG. 2 is a diagram illustrating a thin lens element 200 that is one of the thin lens elements of FIG. 1.

Referring to FIG. 2, a plurality of scatterers 210 are arranged on an arbitrary surface, to form the thin lens element 200. Based on a shape, an arrangement interval and an arrangement shape of the scatterers 210, a waveform of light passing through the thin lens element 200 may change. Light passing through the thin lens element 200 including the scatterers 210 formed as illustrated in FIG. 2 may be concentrated. In other words, the thin lens element 200 of FIG. 2 may perform a function of a lens with a positive refractive power.

FIG. 3 is a diagram illustrating the thin lens element 121. Although the thin lens element 121 is illustrated as an example in FIG. 3, description provided with reference to FIG. 3 is also applicable to the thin lens elements 122 and 123.

Referring to FIG. 3, scatterers 330 having a pillar structure may be arranged on an arbitrary plane. The scatterers 330 may each have a cylindrical shape as shown in FIG. 3, however, example embodiments are not limited thereto. For example, the scatterers 330 may have various shapes, for example, polygonal prism shapes, circular cylindrical shapes, or elliptic cylindrical shapes. Also, the scatterers 330 may have a pillar structure with a cross-section of an "L" shape that is parallel to a plane of a substrate. Although a plane on which the scatterers 330 are arranged is mainly one surface of a substrate, example embodiments are not limited thereto. The scatterers 330 may be spaced apart from a sensing element by an arbitrary support member.

A refractive index of a material included in the scatterers 330 may be higher than a refractive index of a material included in a substrate. Thus, the substrate may include a material with a first refractive index, the scatterers 330 may include a material with a second refractive index, and the second refractive index may be higher than the first refractive index. For example, the scatterers 330 may include at least one from among crystalline silicon (c-Si), polycrystalline silicon (poly Si), amorphous silicon (amorphous Si), $Si_3N_4$, GaP, $TiO_2$, AlSb, AlAs, AlGaAs, AlGaInP, BP, and $ZnGeP_2$. Also, the substrate may include one of a polymer such as PMMA or PDMS, $Si_3N_4$, and $SiO_2$. An additional clad layer may be formed to enclose and cover the scatterers 330 having a relatively high refractive index on the substrate including a material having a relatively low refractive index.

Although the scatterers 330 may be formed on one surface of the substrate or the substrate may include only the material with the first refractive index, example embodiments are not limited thereto. For example, the scatterers 330 may be supported by an arbitrary support member without a substrate and spaced part from a sensing element, the substrate may include an air layer due to an empty space in the substrate, or the substrate and a sensing element may be spaced part from each other with an air layer therebetween. Thus, at least a portion of an air layer may be present between the scatterers 330 and the sensing element, and the second refractive index may be higher than a refractive index of the air layer.

An arrangement shape, for example, an arrangement pattern, of the scatterers 330 may be determined based on a wavelength band of light that is concentrated by the thin lens element 121. For example, an interval T between the scatterers 330 included in the thin lens element 121 and an arrangement direction of the scatterers 330 may be determined based on a first wavelength $\lambda_1$ of light concentrated by the thin lens element 121. The interval T between the scatterers 330 in the thin lens element 121 may be less than the first wavelength $\lambda_1$. For example, the interval T between the scatterers 330 in the thin lens element 121 may be less than or equal to ¾ or ⅔ of the first wavelength $\lambda_1$. Also, a height h of a scatterer 330 in the thin lens element 121 may be less than the first wavelength $\lambda_1$. For example, the height h may be less than or equal to ⅔ of the first wavelength $\lambda_1$.

In an example, scatterers included in each of thin lens elements may each have a pillar structure. The pillar structure may have a cross-sectional shape of one of a circle, an oval, a rectangle, and a square. The pillar structure may be appropriately tilted in a height direction. Also, shapes of the scatterers are not limited thereto, and the scatterers may have a polygonal prism shape, or a pillar structure with a cross section having an "L" shape. In another example, the scatterers may be configured with a multi-layer structure formed of materials with different refractive indices in a height direction. Shapes of the scatterers may not have symmetricity in a predetermined direction. For example, a cross section of each of the scatterers may have a shape that is non-symmetrical in a horizontal direction such as, for example, an oval shape. Also, when cross sections of the scatterers change based on their height, the shapes of the scatterers may not have symmetricity with respect to the height.

A wavelength selectivity of thin lens elements may vary depending on the shapes of the scatterers 330. The wavelength selectivity may refer to a characteristic that each of the thin lens elements of selectively concentrating light of a predetermined wavelength band on a sensing array including a sensing element. For example, the scatterers 330 in the thin lens element 121 may have a shape suitable to concentrate light of the first wavelength band including the first wavelength $\lambda_1$. For example, a cross-sectional shape of the scatterers 330, and a ratio between a width and a height of the scatterers 330 may change. Also, scatterers included in the thin lens element 122 may have a shape suitable to concentrate light of a second wavelength band including a second wavelength $\lambda_2$. Also, scatterers included in the thin lens element 123 may have a shape suitable to concentrate light of a third wavelength band including a third wavelength $\lambda_3$.

Although the wavelength selectivity of the thin lens element varies depending on the shapes of the scatterers 330, example embodiments are not limited thereto. The wavelength selectivity of the thin lens element may vary depending on, for example, a height of each scatterer and an interval between scatterers. Also, a focal length of a thin lens element may vary depending on shapes and heights of the scatterer 330 and an interval between the scatterers 330. The shapes and heights of the scatterers 330 and the interval between the scatterers 330 may be determined based on a typical meta lens design method.

Although the shapes of the scatterers 330 of the thin lens element 121 have been mainly described above, example embodiments are not limited thereto. The above description of the scatterers 330 is also applicable to scatterers included in each of the thin lens elements 122 and 123. Shapes, an arrangement interval and an arrangement direction of the scatterers may vary depending on a wavelength selectivity and a focal length of each thin lens element. For example, an interval between scatterers included in the thin lens element 122 and heights of the scatterers may be determined based on the second wavelength $\lambda_2$. The interval between the scatterers in the thin lens element 122 and the heights of the scatterers may be less than the second wavelength $\lambda_2$. Also, an interval between scatterers included in the thin lens element 123 and heights of the scatterers may be determined based on the third wavelength $\lambda 3$. The interval between the scatterers in the thin lens element 123 and the heights of the scatterers may be less than the third wavelength $\lambda 3$.

A thin lens element may be referred to as a "meta lens element."

Figure 4:
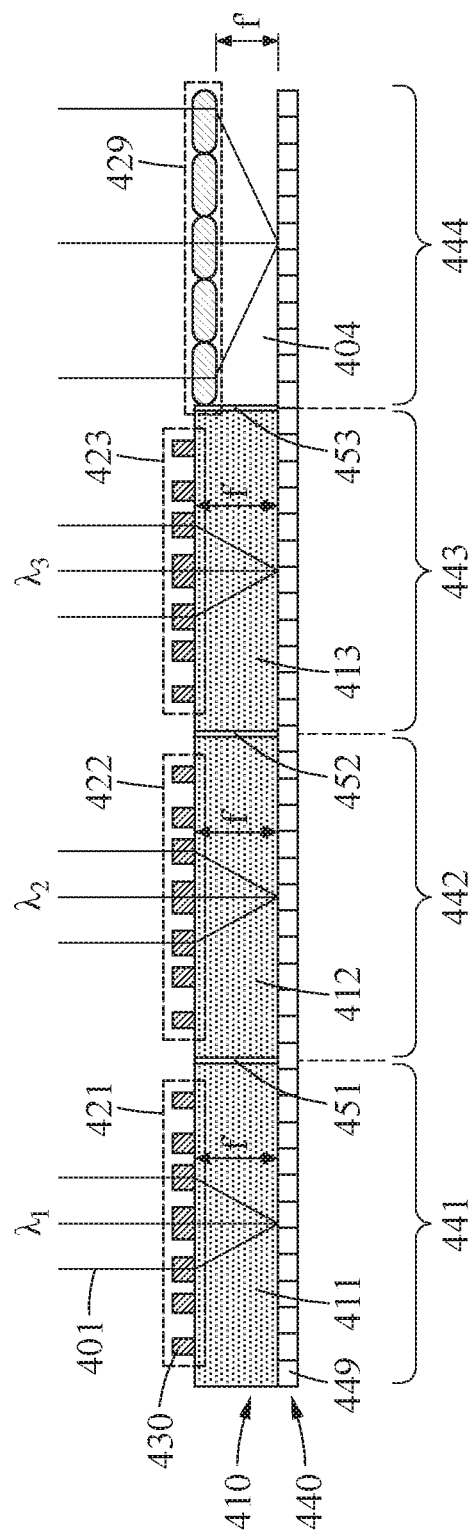
FIG. 4 is a cross-sectional view of an image sensor including thin lens elements that transmit light of different wavelength bands and micro lens elements that transmit light of a wide band, according to example embodiments.

FIG. 4 is a cross-sectional view of an image sensor that includes thin lens elements that transmit light of different wavelength bands and micro lens elements that transmit light of a wide band, according to example embodiments.

The image sensor of FIG. 4 may include a plurality of thin lens elements 421, 422 and 423, monochrome lens elements, and a sensing element 449. Also, a substrate 410 may be located between the sensing element 449 and the plurality of thin lens elements 421, 422 and 423 and between the sensing element 449 and the monochrome lens elements.

The plurality of thin lens elements 421, 422 and 423 may each include a plurality of scatterers 430 located to concentrate light of a partial wavelength band (for example, a color wavelength band) among light incident on the image sensor. Each of the plurality of scatterers 430 may change a path of light by delaying a phase of light incident on a corresponding scatterer. Each of the plurality of scatterers 430 may transmit light of a wavelength band based on shapes and an arrangement of a plurality of scatterers 430 included in a corresponding thin lens element, and an interval between the scatterers 430. Examples of the shapes and the arrangement of the scatterers 430 have been described above with reference to FIGS. 1 through 3, and thus further description thereof is not repeated herein.

At least two thin lens elements among the plurality of thin lens elements 421, 422 and 423 may transmit light of different wavelength bands. The plurality of thin lens elements 421, 422 and 423 may be designed to concentrate the transmitted light to a sensing array 440. For example, the thin lens element 421 among the plurality of thin lens elements 421, 422 and 423 may transmit light of a first wavelength band corresponding to a first color. The thin lens element 422 may transmit light of a second wavelength band corresponding to a second color. The thin lens element 423 may transmit light of a third wavelength band corresponding to a third color. The first color, the second color and the third color may be different from each other. The first wavelength band may include a first wavelength $\lambda_1$, the second wavelength band may include a second wavelength $\lambda_2$, and the third wavelength band may include a third wavelength $\lambda_3$. For example, at least two thin lens elements among the thin lens elements 421, 422 and 423 may have wavelength selectivity for different wavelengths.

For example, the first wavelength band may correspond to a red spectrum and may have a wavelength range of 620 nanometers (nm) to 750 nm, and the first wavelength $\lambda_1$ may be 656 nm. The second wavelength band may correspond to a green spectrum and may have a wavelength range of 495 nm to 570 nm, and the second wavelength $\lambda_2$ may be 555 nm. The third wavelength band may correspond to a blue spectrum and may have a wavelength range of 450 nm to 495 nm, and the third wavelength $\lambda_3$ may be 454 nm. A color wavelength band may refer to a wavelength band indicating an arbitrary color, and may be, for example, one of the first wavelength band, the second wavelength band, and the third wavelength band. However, wavelength bands for each color are an example, and example embodiments are not limited thereto. The above-described wavelength bands for each color do not overlap, however, color wavelength bands that are adjacent to each other may partially overlap. For example, a red band and a green band may overlap, or the green band and a blue band may overlap. Due to a narrow bandwidth of a meta lens designed to transmit only light of a wavelength for each color, the meta lens may have a relatively low chromatic aberration and a relatively low thickness.

The plurality of thin lens elements 421, 422 and 423 may have the same focal length f, and a thickness of each of a first portion 411, a second portion 412 and a third portion 413 of the substrate 410 that support each thin lens element may also be equal to the focal length f.

The monochrome lens elements may concentrate light of a monochrome wavelength band that is wider than the color wavelength band. The monochrome wavelength band may be, for example, a wide band including all the first wavelength band, the second wavelength band and the third wavelength band that are described above, and may further include an infrared band and an ultraviolet band. For example, the monochrome lens elements may include a micro lens array 429 that concentrates light of the monochrome wavelength band. In another example, the monochrome lens elements may include a thin lens element that concentrates light of the monochrome wavelength band. However, an example of the monochrome lens elements is not limited thereto, and the monochrome lens elements may include lenses that are thin and that have various shapes, materials and structures that enable sensing of a monochrome wavelength band. An example in which a monochrome lens element includes the micro lens array 429 will be mainly described below.

The micro lens array 429 may include a plurality of micro lens elements arranged on a plane of an array. The micro lens array 429 may concentrate light of a wavelength band wider than a partial wavelength band. For example, the micro lens array 429 may transmit light in a wavelength band that is wider than a range including the first wavelength band, the second wavelength band and the third wavelength band. For example, the micro lens array 429 may transmit light in a visible light band (for example, a wavelength range of 390 nm to 700 nm).

A thin lens element including scatterers 430 may form a sharp focal point with respect to a narrow wavelength band, but may form a blur focal point with respect to a wide band, which may cause an optical aberration. Although a thickness of the micro lens array 429 is greater than those of the scatterers 430, the micro lens array 429 may form a sharp focal point even for the wide band. Thus, the micro lens array 429 may form a sharp focal point while receiving a large amount of light in comparison to the thin lens elements 421, 422 and 423 by transmitting light of the wide band. A filter to block the infrared band may also be added onto the micro lens array 429. However, example embodiments are not limited thereto, and the filter on the micro lens array 429 may block the ultraviolet band as well as the infrared band and may be disposed on the thin lens elements 421, 422 and 423.

Also, a focal length f' of the micro lens array 429 may differ from the focal length f of the thin lens elements 421, 422 and 423. However, example embodiments are not limited thereto, and the focal length f' of the micro lens array 429 may be equal to the focal length f of the thin lens elements 421, 422 and 423. In an example, when a lens size of a micro lens element included in the micro lens array 429 decreases, the focal length f' may decrease. In this example, the lens size of the micro lens element may be determined such that the focal length f' of the micro lens element may be similar or identical to the focal length f of the thin lens elements 421, 422 and 423. In another example, a sum of a thickness and the focal length f of a thin lens element may be designed to be equal to a sum of a thickness and the focal length f' of the micro lens array. In this example, the image sensor may have an overall uniform height. As described above, when a size of the micro lens element decreases, the focal length f' and a thickness of the micro lens element may decrease and the optical aberration may also be reduced.

The plurality of thin lens elements 421, 422 and 423 and the micro lens array 429 may be located to form a focal point on a plane of the sensing array 440 in which the sensing element 449 is arranged. Light 401 may be concentrated on the sensing array 440 by the thin lens elements 421, 422 and 423 and the micro lens array 429.

The sensing element 449 may sense light passing through the plurality of thin lens elements 421, 422 and 423 and the micro lens array 429. The sensing element 449 may be arranged on a plane of the sensing array 440, and a sensing region to which the sensing element 449 belongs may be classified by a lens element that covers the sensing element 449.

At least two thin lens elements among the thin lens elements 421, 422 and 423 may have different wavelength selectivities, and thus at least two sensing regions among sensing regions 441, 442 and 443 may measure sensing information corresponding to different colors. Thus, a color image may be acquired by synthesizing first sensing information through third sensing information measured in the sensing regions 441, 442 and 443.

The substrate 410 may be formed of a transparent material, and may be referred to as a "transparent substrate 410." The transparent substrate 410 may space each of the plurality of thin lens elements 421, 422 and 423 apart from the sensing array 440 by a focal length of a corresponding lens element. The thin lens elements 421, 422 and 423 of FIG. 4 have the same focal length f, and thus the transparent substrate 410 may support the thin lens elements 421, 422 and 423 at positions spaced apart from the sensing array 440 by the focal length f. When the micro lens array 429 has the focal lengths f' different from the focal length f, the micro lens array 429 may be supported by a support member, for example, a spacer, and may be spaced apart from the sensing array 440 by the focal length f, and a fourth portion 404 may include an air layer. However, example embodiments are not limited thereto, and the fourth portion 404 may include the transparent substrate 410 with the same thickness as the focal length f.

In another example, when the focal length f of the thin lens elements 421, 422 and 423 and the focal length f' of the micro lens array 429 are identical to each other, the transparent substrate 410 with a thickness corresponding to the focal length f may support all the thin lens elements 421, 422 and 423 and the micro lens array 429. The transparent substrate 410 may space the plurality of thin lens elements 421, 422 and 423 and the micro lens array 429 apart from the sensing element 449 by the focal length f. All the first portion 411, the second portion 412 and the third portion 413 of the transparent substrate 410, the fourth portion 404 may have the same height, for example, the focal length f. The micro lens array 429 may be formed on one surface of the transparent substrate 410. Accordingly, the thin lens elements 421, 422 and 423 and the micro lens array 429 may be formed on a substrate with the same height, and thus it is possible to simplify a manufacturing process of the image sensor and reduce manufacturing costs.

The transparent substrate 410 may further include block units 451, 452 and 453. The block units 451, 452 and 453 may block light passing through one of the plurality of thin lens elements 421, 422 and 423 from being incident on a sensing region covered by another thin lens element. The block units 451, 452 and 453 may be located along at least a portion of an outer boundary of the sensing region. The block units 451, 452 and 453 may also be located in a position in which one sensing region is in contact with another sensing region. The block unit 451 may block light passing through the thin lens element 421 from being incident toward the sensing region 442. Also, the block unit 451 may block light passing through the thin lens element 422 from being incident toward the sensing region 441. The block unit 452 may block light passing through the thin lens element 422 from being incident toward the sensing region 443. Also, the block unit 452 may block light passing through the thin lens element 423 from being incident toward the sensing region 442. The block unit 453 may block light passing through the thin lens element 423 from being incident toward a fourth sensing region. Also, the block unit 453 may block light passing through the micro lens array 429 from being incident toward the sensing region 443. Thus, the block units 451, 452 and 453 may prevent information other than desired information from being sensed from each sensing region. Although the block units 451, 452 and 453 in a structure in which lens elements are arranged in a line have been described with reference to FIG. 4, the block units 451, 452 and 453 may enclose each sensing region when lens elements are arranged in another planar structure.

Sensing regions of the sensing array 440 may sense image information about an image with a focal point formed in accordance with a field of view (FOV) of corresponding lens element among lens elements having different fields of view (FOV).

Figure 5:
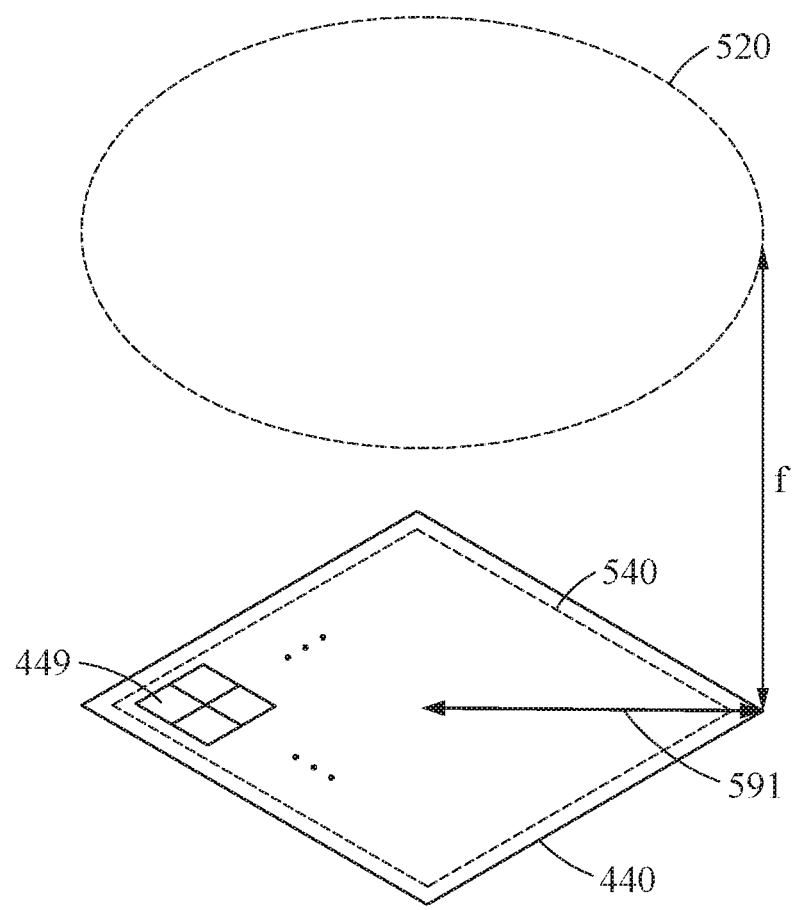
FIG. 5 is a diagram illustrating a sensing region that is covered by a lens element, according to example embodiments.

FIG. 5 is a diagram illustrating a sensing region that is covered by a lens element, according to example embodiments.

Referring to FIG. 5, an image sensor includes a sensing array 440, and a lens element 520 spaced apart from the sensing array 440 by a focal length f. When the lens element 520 is a thin lens element, the lens element 520 may include scatterers 430. When the lens element 520 is a micro lens element, the micro lens element may include an optical lens. The sensing array 440 may include a plurality of sensing elements 449.

An individual lens element 520 may cover a predetermined sensing region 540 of the sensing array 440 corresponding to a lens size of the lens element 520. The lens size may correspond to an area occupied by each lens element. When the lens element 520 is a thin lens element, the lens size may be a size of a region in which scatterers 430 are arranged and may correspond to, for example, a diameter when the region has a circular shape. When the lens element 520 is a micro lens element, the lens size may correspond to a diameter of an optical lens.

The sensing region 540 may refer to a region on the sensing array 440 that is reached by rays within a predetermined FOV by passing through the lens element 520. The sensing region 540 covered by the lens element 520 in the sensing array 440 may be determined based on a lens size of the lens element 520. A size of the sensing region 540 may be represented as a distance 591 from a center point of the sensing region 540 to an outermost point of the sensing region 540. In other words, light passing through the lens element 520 may be incident on sensing elements 449 of the sensing array 440 included in the sensing region 540. Light may include a plurality of rays. A ray may correspond to a flow of a photon.

At least one, for example, the lens element 520, of a plurality of lens elements may be arranged eccentrically with respect to any one or any combination of a plurality of sensing elements 449. For example, the lens element 520 may cover a non-integer number of sensing elements 449, instead of covering an integer number of sensing elements 449. Each lens element 520 may cover P/L sensing elements, and P/L may refer to a ratio between a number P of sensing elements and a number L of lens elements. The numbers L and P may be relatively prime, and P/L may be determined as a real number. For example, FIG. 4 is a cross-sectional view of the image sensor, and the thin lens element 421 may cover "37/3" sensing elements 449 with respect to an arbitrary one axis of the image sensor. The micro lens array 429 may cover "12" sensing elements, and the micro lens array 429 may include five micro lens elements, and accordingly each of the micro lens elements of the micro lens array 429 may cover "12/5" sensing elements 449.

As described above, the image sensor may have an arrangement of the lens elements 520 that have slightly different optical center axes (OCAs) than those of sensing elements in the sensing array 440. Thus, each lens element 520 may receive different optical information. Because a direction of a chief ray of each lens element 520 is also changed, the image sensor may optically acquire a larger amount of sensing information. Thus, the image sensor may restore an image with a higher resolution based on a variety of sensing information acquired as described above.

Figure 6:
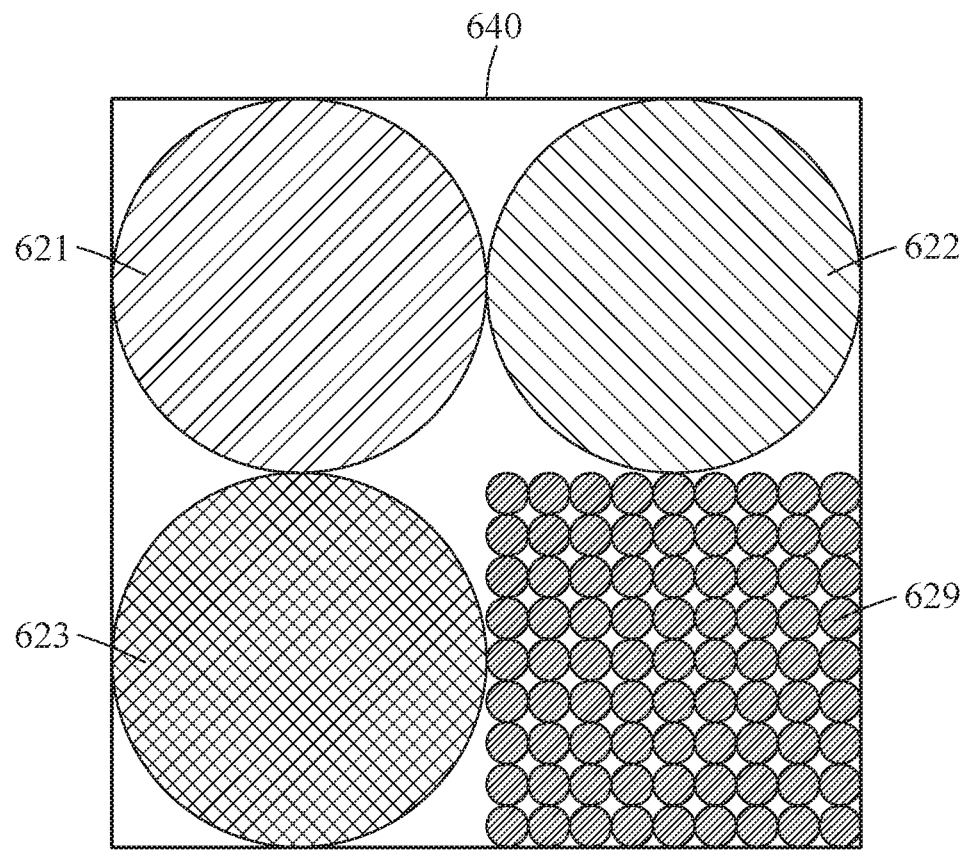
FIG. 6 is a top view of thin lens elements and micro lens elements, according to example embodiments.

FIG. 6 is a top view of thin lens elements and micro lens elements, according to example embodiments.

Referring to FIG. 6, a thin lens element 621 may transmit light in a red wavelength band. A thin lens element 622 may transmit light in a green wavelength band. A thin lens element 623 may transmit light in a blue wavelength band. A micro lens array 629 may transmit light in a visible light band. The thin lens elements 621, 622 and 623, and the micro lens array 629 may be arranged on a plane parallel to a plane of a sensing array 640. As shown in FIG. 6, each of the thin lens elements 621, 622 and 623, and the micro lens array 629 may cover partial regions (for example, sensing regions) of the sensing array 640. However, an arrangement of lens elements is not limited to that of FIG. 6. For example, lens elements may be arranged in a line.

Figure 7:
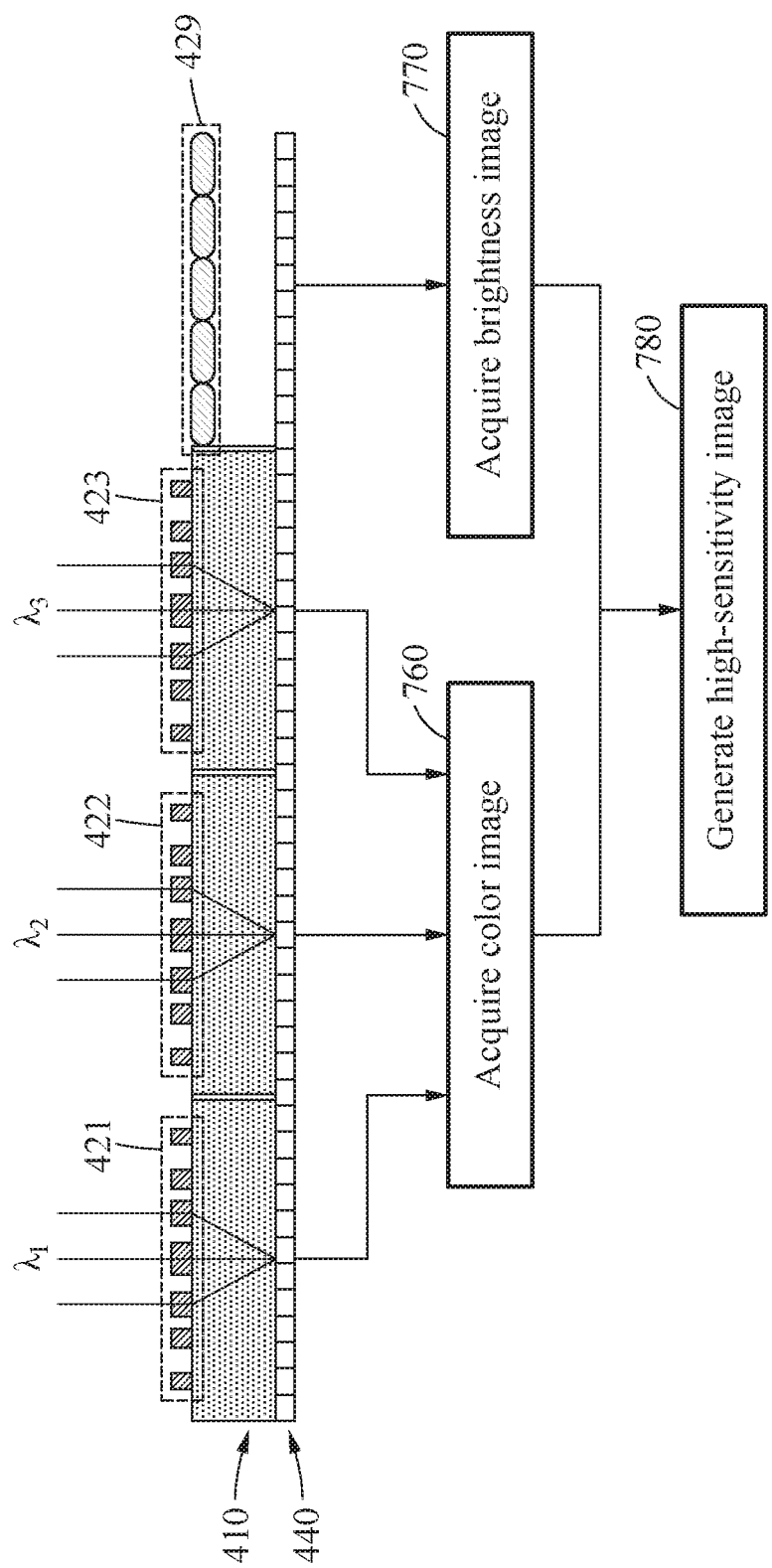
FIG. 7 is a diagram illustrating an operation by which an image sensor generates a high resolution image, according to example embodiments.

FIG. 7 is a diagram illustrating an operation by which an image sensor generates a high resolution image, according to example embodiments.

A processor may generate a high sensitivity image based on information sensed by a sensing array 440. The processor may increase a sensitivity of a sensor in a low illuminance environment by synthesizing information of an existing color spectrum using information about an entire visible light band acquired by the micro lens array 429.

For example, as described above, a first sensing region covered by the thin lens element 421 may measure information corresponding to a first color. A second sensing region covered by the thin lens element 422 and a third sensing region covered by the thin lens element 423 may measure information corresponding to a second color and information corresponding to a third color, respectively. A fourth sensing region covered by the micro lens array 429 may measure information corresponding to a luminance, because the fourth sensing region receives light of all colors.

Referring to FIG. 7, in operation 760, the processor may acquire a color image based on information measured by sensing regions covered by thin lens elements. For example, the processor may generate a first color channel image based on the information corresponding to the first color measured by the first sensing region. The processor may generate a second color channel image based on the information corresponding to the second color measured by the second sensing region, and generate a third color channel image based on the information corresponding to the third color measured by the third sensing region. The first color channel image, the second color channel image and the third color channel image may be a red channel image, a green channel image, and a blue channel image, respectively. However, a color space is not limited to an RGB space as described above, and color channel images based on another color space may also be acquired. The processor may acquire a color image from color channel images. For example, the processor may acquire an RGB image from three color channel images.

The processor may acquire a chrominance channel image by converting the color image. For example, the processor may acquire a YCbCr image by converting the RGB image. A Cb component and a Cr component may correspond to chrominance components. Thus, the processor may calculate chrominance information from a sensing region covered by the plurality of thin lens elements 421, 422 and 423 in the sensing array 440 in which sensing elements are arranged.

In operation 770, the processor may acquire a brightness or luminance image. For example, the processor may calculate luminance information from a sensing region covered by the micro lens array 429. For example, the micro lens array 429 may include a plurality of micro lens element arranged on an arbitrary virtual plane spaced apart from a sensing array. The processor may acquire a compound eye vision (CEV) image based on light received by a sensing element through the plurality of micro lens elements, and may calculate luminance information based on the CEV image.

For example, a fourth sensing region covered by the micro lens array 429 may sense low resolution images corresponding to a number of micro lens elements as a CEV image. A resolution of each of the low resolution images may correspond to a sensing element covered by each of the micro lens elements. Thus, when a size of each of the micro lens elements decreases, a focal length of each of the micro lens elements and a resolution of each of the low resolution images may also decrease. For example, when the micro lens array 429 includes n×m micro lens elements, n×m low resolution images may be acquired in the fourth sensing region. In this example, n and m may be an integer greater than or equal to 1.

The processor may rearrange and combine pixels of a plurality of low resolution images included in the CEV image. The processor may rearrange pixels of the CEV image such that pixels corresponding to rays reflected from the same point may be adjacent to each other, to acquire a single high resolution image. The single high resolution image may have a resolution approximately n×m times that of an individual low resolution image. To convert the CEV image to a single high resolution image, various image restoration algorithms may be used. As described above, because the fourth sensing region senses light of a wide band instead of distinguishing wavelength bands based on colors, a single image may be a monochromatic image. In the monochromatic image, an intensity indicated by each pixel may be a luminance. In other words, the above-described monochromatic image may be referred to as a luminance image. The processor may use information acquired by the micro lens array 429 as new luminance information Y' to restore a scene image in operation 780.

In operation 780, the processor may generate a high sensitivity image. For example, the processor may generate a scene image based on the chrominance information and the luminance information. For example, the processor may acquire chrominance information of a Cb component and a Cr component in operation 760, and may acquire a luminance image of a Y' component in operation 770. The processor may acquire a new R'G'B' image from the Y' component, the Cb component and the Cr component. Although the existing RGB image does not have sufficient luminance information because only light of a limited wavelength band is received, luminance information may be reinforced by the Y' component in the R'G'B' image. The new R'G'B' image may represent improved luminance information in comparison to the color image acquired in operation 760. Thus, the processor may generate a high sensitivity scene image with a high resolution from image information acquired at a low illuminance.

The first color channel image, the second color channel image, the third color channel image, and the luminance image acquired in individual sensing regions may correspond to different viewpoints. This is because physical positions of central optical axes of lens elements covering each sensing region are different from each other. The processor may match the first color channel image, the second color channel image, the third color channel image and the luminance image at an arbitrary reference viewpoint. For example, the first color channel image, the second color channel image and the third color channel image may be converted to a viewpoint of the luminance image. The processor may convert images such that viewpoints and/or optical axes of the images may be matched, may extract chrominance information and luminance information from each of the images, and may generate a scene image representing a high sensitivity even in a low illuminance environment from the extracted chrominance information and the extracted luminance information.

Figure 8:
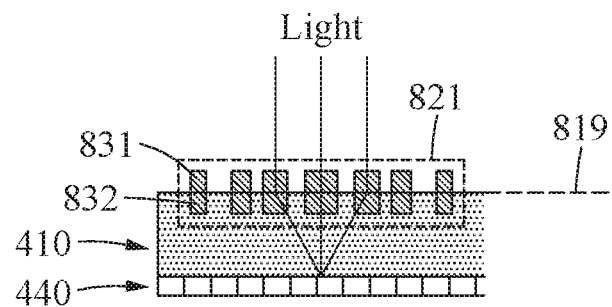
FIG. 8 is a cross-sectional view of a structure in which scatterers are arranged on both sides, according to example embodiments.

FIG. 8 is a diagram illustrating a structure in which scatterers are arranged on both sides, according to example embodiments.

Referring to FIG. 8, lens elements 821 may each include a plurality of scatterers 831. The plurality of scatterers 831 included in the lens elements 821 may be arranged on one surface of a transparent substrate.

In FIG. 8, at least a portion, for example, scatterers 831, of a plurality of scatterers 831 and 832 may protrude outward from the transparent substrate. The other scatterers, for example, scatterers 832, may be formed in the transparent substrate. However, example embodiments are not limited to the transparent substrate, and the scatterers 831 may be disposed on an opposite side of the scatterers 832 based on a virtual plane 819 parallel to a plane on which sensing elements are arranged. Thus, the scatterers 831 and 832 may also be disposed on both sides of an arbitrary surface. As described above, an arrangement of the scatterers 831 and 832 may vary depending on a wavelength selectivity and a focal length of each of lens elements 821, 822 and 823.

Figure 9:
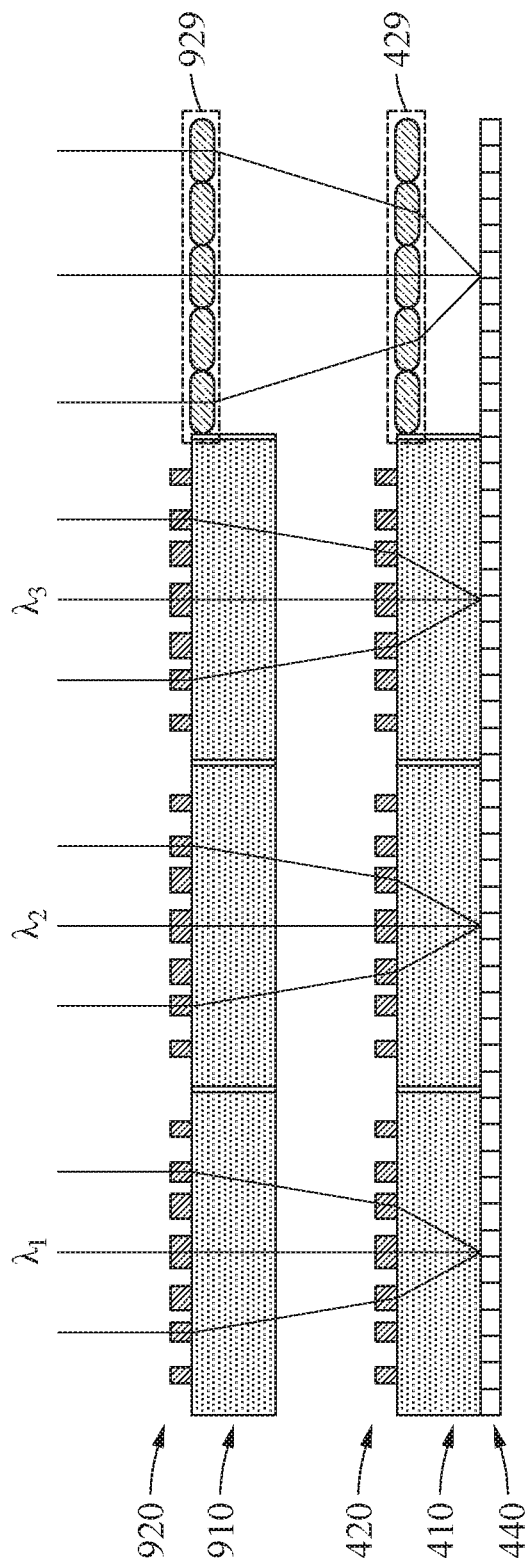
FIG. 9 is a cross-sectional view of a structure in which lens elements are formed on a plurality of layers, according to example embodiments.

FIG. 9 is a cross-sectional view of a structure in which lens elements are formed on a plurality of layers, according to example embodiments.

An image sensor may further include additional lens elements 920 and 929. For example, the additional lens elements 920 and 929 may be spaced apart from a plurality of lens elements 420 and 429 and may be configured to transfer light incident on the image sensor to the plurality of lens elements 420 and 429. FIG. 9 illustrates an additional substrate 910 spaced apart from a thin lens element by a predetermined height. The additional substrate 910 may space the additional lens elements 920 and 929 apart from the plurality of lens elements 420 and 429. However, example embodiments are not limited thereto, and the additional substrate 910 may be formed adjacent to the plurality of lens elements 420 and 429. Also, only the additional lens elements 920 and 929 may be disposed without the additional substrate 910. A refractive power of the plurality of lens elements 420 may be supplemented by a refractive power of the additional lens elements 920 and 929. Although the same type of lens elements (for example, thin lens elements or micro lens elements) for the same sensing region is disposed as an additional layer as shown in FIG. 9, example embodiments are not limited thereto. Also, different types of lens elements may be additionally disposed.

In the sensing array 440, a lens element and an additional lens element that cover the same sensing region may have the same wavelength selectivity. Also, a focal point formed by a combination of the lens element and additional lens element may be formed on the sensing array 440.

Figure 10:
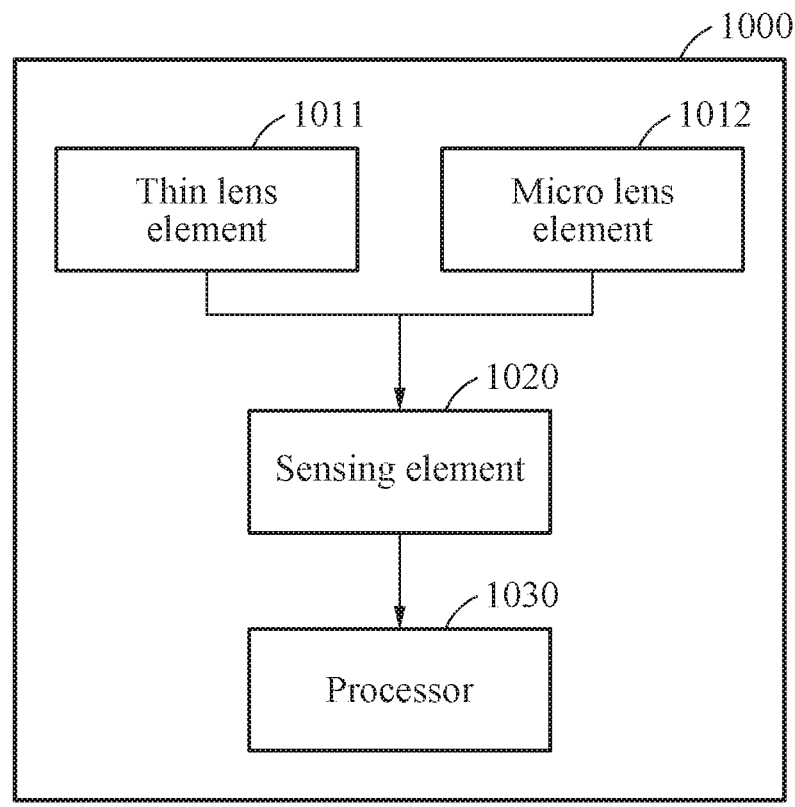
FIG. 10 is a block diagram of an image sensor according to example embodiments.

FIG. 10 is a block diagram of an image sensor 1000 according to example embodiments.

Referring to FIG. 10, the image sensor 1000 includes a thin lens element 1011, a micro lens element 1012, a sensing element 1020, and a processor 1030.

A plurality of thin lens elements may each include a plurality of scatterers. The plurality of thin lens elements may concentrate light of a partial wavelength band among light incident on the image sensor 1000. The plurality of thin lens elements may be designed to transmit light of different wavelength bands and to have the same focal length. A structure of a scatterer of a meta lens may be designed such that an image may be clearly formed at a focal length of each sensing array.

A micro lens array may include a plurality of micro lens elements. The micro lens element 1012 may be arranged on an arbitrary virtual plane. For example, the micro lens element 1012 may be spaced apart from a plane of the sensing array by a focal length. The micro lens array may concentrate light in a wavelength band wider than the partial wavelength band. For example, the micro lens array may be designed to transmit light of a visible light band. A focal length of the micro lens array may be designed to be different from a focal length of the thin lens element 1011, however, example embodiments are not limited thereto, and may be designed to be equal to the focal length of the thin lens element 1011.

The sensing element 1020 may sense light passing through a plurality of thin lens elements and the micro lens array. The sensing element 1020 may be arranged on a plane of a sensing array.

The processor 1030 may acquire a color image from a sensing region covered by the thin lens element 1011, and may acquire a luminance image from a sensing region covered by the micro lens array. The processor 1030 may restore a new scene image with a high sensitivity even in a low illuminance from the luminance image and the color image.

A configuration and an operation of each of the thin lens element 1011, the micro lens element 1012, the sensing element 1020 and the processor 1030 have been described above with reference to FIGS. 1 through 9, and thus further description thereof is not repeated herein.

The image sensor 1000 may be implemented as a mobile terminal. For example, the image sensor 1000 may be mounted as a front camera and/or a rear camera of a smartphone. However, example embodiments are not limited thereto, and the image sensor 1000 may be implemented as, for example, a digital single-lens reflex (DSLR) camera, a vision camera for recognition of, for example, a vehicle, a drone or a closed-circuit television (CCTV), a webcam camera for video calls, 360-degrees virtual reality (VR) camera, a professional camera for movies or broadcasts or a VR/augmented reality (AR) camera.

Also, the image sensor 1000 may optically acquire images captured at different zoom magnifications using lens elements with different FOV. The image sensor 1000 may calculate a depth of an object captured from different viewpoint information by a multi-array lens in which lens elements are arranged. The image sensor 1000 may calculate three-dimensional (3D) coordinate information of the captured object, based on the depth of the captured object. The image sensor 1000 may generate a new composite image at a new viewpoint based on the depth of the captured object and viewpoint information. Also, the image sensor 1000 may readjust a focus on the object based on the depth of the captured object.

The example embodiments described herein may be implemented using hardware components, software components, or a combination thereof. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The method according to the above-described example embodiments may be recorded in non-transitory computer-readable media including program instructions to implement various operations that may be performed by a computer. The media may also include, alone or in combination with the program instructions, data files, data structures, and the like. The program instructions recorded on the media may be those specially designed and constructed for the purposes of the example embodiments, or they may be of the well-known kind and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as code produced by a compiler, and files containing higher level code that may be executed by the computer using an interpreter. The described hardware devices may be configured to act as one or more software modules to perform the operations of the above-described example embodiments, or vice versa.

While this disclosure includes example embodiments, it will be apparent to one of ordinary skill in the art that various changes in form and details may be made in these example embodiments without departing from the spirit and scope of the claims and their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor comprising:
   a plurality of thin lens elements, each of the plurality of thin lens elements comprising a plurality of scatterers configured to concentrate light of a partial wavelength band among light incident on the image sensor;
   a micro lens array configured to concentrate light of a wavelength band including a range of at least two partial wavelength bands among a plurality of partial wavelength bands corresponding to the plurality of thin lens elements;
   a sensing element configured to sense light passing through the plurality of thin lens elements and the micro lens array, the micro lens array comprising a plurality of micro lens elements arranged along an array plane; and
   a processor configured to:
      obtain chrominance information from a sensing region covered by the plurality of thin lens elements in a sensing array in which the sensing element is arranged, and obtain luminance information from a sensing region covered by the micro lens array,
      obtain a compound eye vision (CEV) image, based on light that is sensed by the sensing element through the plurality of micro lens elements,
      obtain the luminance information, from information obtained by rearranging pixels of a plurality of low-resolution images included in the obtained CEV image such that pixels corresponding to rays reflected from a same point are adjacent to each other, and
      obtain an image, based on the chrominance information from the sensing region covered by the plurality of thin lens elements and the luminance information from the CEV image.

2. The image sensor of claim 1, wherein at least two among the plurality of thin lens elements are configured to concentrate light in different wavelength bands.

3. The image sensor of claim 1, wherein a first one among the plurality of thin lens elements is configured to concentrate light in a first wavelength band corresponding to a first color,
   a second one among the plurality of thin lens elements is configured to concentrate light in a second wavelength band corresponding to a second color different from the first color, and
   a third one among the plurality of thin lens elements is configured to concentrate light in a third wavelength band corresponding to a third color different from the first color and the second color.

4. The image sensor of claim 3, wherein the micro lens array is further configured to concentrate the light of the wavelength band including a range comprising the first wavelength band, the second wavelength band and the third wavelength band.

5. The image sensor of claim 1, wherein the plurality of thin lens elements and the micro lens array are disposed to form a focal point on a plane of a sensing array in which the sensing element is arranged.

6. The image sensor of claim 1, wherein each of the plurality of scatterers is further configured to change a path of light incident on a respective one of the plurality of scatterers by delaying a phase of the light incident on the respective one of the plurality of scatterers.

7. The image sensor of claim 1, wherein the plurality of scatterers is further configured to concentrate the light of the partial wavelength band, based on shapes and an arrangement of the plurality of scatterers and an interval between the plurality of scatterers.

8. The image sensor of claim 1, further comprising a transparent substrate interposed between the sensing element and the micro lens array and between the sensing element and the plurality of thin lens elements.

9. The image sensor of claim 8, wherein the transparent substrate comprises a block unit configured to block light passing through a first one among the plurality of thin lens elements from being incident on a sensing region covered by a second one among the plurality of thin lens elements.

10. The image sensor of claim 9, wherein the block unit is disposed along a portion of an outer boundary of the sensing region.

11. The image sensor of claim 8, wherein the transparent substrate is configured to space apart the plurality of thin lens elements and the micro lens array from the sensing element by a focal length, and
   the micro lens array is disposed on a surface of the transparent substrate.

12. The image sensor of claim 8, wherein the plurality of scatterers is disposed on a surface of the transparent substrate.

13. The image sensor of claim 12, wherein a portion of the plurality of scatterers protrudes outward from the transparent substrate, and another portion of the plurality of scatterers is disposed in the transparent substrate.

14. The image sensor of claim 1, wherein a portion of the plurality of scatterers is disposed to face another portion of the plurality of scatterers, based on a virtual surface parallel to a plane on which the sensing element is disposed.

15. The image sensor of claim 1, further comprising additional lens elements configured to concentrate the light incident on the image sensor to the plurality of thin lens elements, the additional lens elements being spaced apart from the plurality of thin lens elements.

16. The image sensor of claim 1, wherein the image sensor is implemented as a mobile terminal.

17. An image sensing method performed by an image sensor, the image sensing method comprising:

concentrating, by a plurality of scatterers included in each of a plurality of thin lens elements, light of a partial wavelength band among light incident on the image sensor;

concentrating, by a micro lens array, light of a wavelength band including a range of at least two partial wavelength bands among a plurality of partial wavelength bands corresponding to the plurality of thin lens elements;

sensing, by a sensing element, light passing through the plurality of thin lens elements and the micro lens array;

obtaining, by a processor, chrominance information from a sensing region covered by the plurality of thin lens elements in a sensing array in which the sensing element is arranged; and obtaining, by the processor, luminance information from a sensing region covered by the micro lens array wherein the micro lens array comprises a plurality of micro lens elements arranged along an array plane, and wherein the obtaining the luminance information comprises:

obtaining, by the processor, a compound eye vision (CEV) image, based on light that is sensed by the sensing element through the plurality of micro lens elements;

obtaining, by the processor, the luminance information, from information obtained by rearranging pixels of a plurality of low-resolution images constituting the obtained CEV image such that pixels corresponding to rays reflected from a same point are adjacent to each other, and obtain an image, based on the chrominance information from the sensing region covered by the plurality of thin lens elements and the luminance information from the CEV image.

18. An image sensor comprising:

a plurality of thin lens elements, each of the plurality of thin lens elements comprising a plurality of scatterers configured to concentrate light of a color wavelength band among light incident on the image sensor;

monochrome lens elements configured to concentrate light of a monochrome wavelength band including a range of at least two partial wavelength bands among a plurality of color wavelength bands corresponding to the plurality of thin lens elements;

a sensing element configured to sense light passing through the plurality of thin lens elements and the monochrome lens elements; and a processor configured to:

obtain chrominance information from a sensing region covered by the plurality of thin lens elements in a sensing array in which the sensing element is arranged, and obtain luminance information from a sensing region covered by a plurality of micro lens elements, obtain a compound eye vision (CEV) image, based on light that is sensed by the sensing element through the monochrome lens elements, obtain the luminance information, from information obtained by rearranging pixels of a plurality of low-resolution images constituting the obtained CEV image such that pixels corresponding to rays reflected from a same point are adjacent to each other, and obtain an image, based on the chrominance information from the sensing region covered by the plurality of thin lens elements and the luminance information from the CEV image.

19. The image sensor of claim 18, wherein the monochrome lens elements comprise a micro lens array configured to concentrate the light of the monochrome wavelength band.

20. The image sensor of claim 18, wherein the monochrome lens elements comprise at least one thin lens element configured to concentrate the light of the monochrome wavelength band.

* * * * *